United States Patent
Aoki et al.

(10) Patent No.: US 7,824,929 B2
(45) Date of Patent: Nov. 2, 2010

(54) METHOD FOR PRODUCING GROUP III NITRIDE-BASED COMPOUND SEMICONDUCTOR

(75) Inventors: Masato Aoki, Aichi-ken (JP); Miki Moriyama, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 174 days.

(21) Appl. No.: 12/289,157

(22) Filed: Oct. 21, 2008

(65) Prior Publication Data

US 2009/0104757 A1 Apr. 23, 2009

(30) Foreign Application Priority Data

Oct. 22, 2007 (JP) .............................. 2007-273615
Sep. 30, 2008 (JP) .............................. 2008-254678

(51) Int. Cl.
*H01L 21/00* (2006.01)
*H01L 21/322* (2006.01)

(52) U.S. Cl. .............................. 438/4; 438/46; 438/483; 438/767; 117/2; 117/90

(58) Field of Classification Search .................. 438/4, 438/46, 477, 483, 767, 799, 906, 964; 117/2, 117/90, 94
See application file for complete search history.

(56) References Cited

U.S. PATENT DOCUMENTS 5,679,152 A * 10/1997 Tischler et al. ................ 117/90
6,211,089 B1 * 4/2001 Kim et al. .................... 438/799
6,488,767 B1 * 12/2002 Xu et al. ........................ 117/2
6,841,274 B2 1/2005 Ueno et al.
2003/0209185 A1 11/2003 Ueno et al.
2005/0173715 A1 8/2005 Kyono et al.
2008/0132044 A1 6/2008 Kyono et al.

FOREIGN PATENT DOCUMENTS

| CN | 1500919 (A) | 6/2004 |
| JP | 2003-327497 | 11/2003 |
| JP | 2004-273484 | 9/2004 |
| JP | 2005-136311 | 5/2005 |

OTHER PUBLICATIONS

Chinese Office Action dated May 11, 2010, with English translation.

* cited by examiner

*Primary Examiner*—Kevin M Picardat
(74) *Attorney, Agent, or Firm*—McGinn IP Law Group PLLC

(57) ABSTRACT

An object of the present invention is to remove microscratches on a surface of a GaN substrate cut from a GaN ingot. The invention is directed to establish a method for surface treatment of a GaN substrate, including heating the surface in an atmosphere containing trimethylgallium, ammonia, and hydrogen. It is preferable that the trimethylgallium feeding rate is 150 μmol/min or higher, the ratio of trimethylgallium feeding rate to ammonia feeding rate (V/III ratio) is 1,200 to 4,000, and the heating temperature is 1,000° C. to 1,250° C. In addition, the temperature of the surface treatment is set to be higher than that of the following GaN growth, and the feed rate of trimethylgallium is lower than that of the growth procedure. RMS of roughness on the substrate was equal to or less than 1.3 nm, and the substrate whose step condition is excellent can be obtained.

20 Claims, 5 Drawing Sheets

METHOD FOR PRODUCING GROUP III NITRIDE-BASED COMPOUND SEMICONDUCTOR

BACKGROUND OF THE INVENTION

1. Field of the Invention

The present invention is related to a method for fabricating Group III nitride-based compound semiconductor products on Group III nitride-based compound semiconductor substrates and, in particular, to such a method including surface treatment of Group III nitride-based compound semiconductor substrates prior to epitaxial growth. The semiconductor substrates are for production of Group III nitride-based compound semiconductor devices, thick films or ingots.

As used herein, the term "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain an n-type/p-type conduction; and such a semiconductor in which a portion of a Group III element is substituted by B or Tl, and a portion of the Group V element is substituted by P, As, Sb, or Bi.

2. Background Art

In recent years, Group III nitride-based compound semiconductor substrates have been available for use as a substrate on which a Group III nitride-based compound semiconductor light-emitting device is formed. For example, a GaN ingot is produced through a variety of techniques, and the ingot is cut to pieces having a thickness of interest, thereby provided as commercial products. When such an ingot is cut, a cut face serves as a main face of a substrate and, therefore, undergoes mechanical polishing and/or chemical mechanical polishing.

Currently, no simple technique has been realized for planarizing, with high precision, a surface of a Group III nitride-based compound semiconductor substrate such as a GaN substrate, since Group III nitride-based compound semiconductors per se have very strong resistance to generally performed wet etching. Thus, when a strong etchant such as an aqueous alkaline solution is employed, the etched surface is provided with undesirably deep pits.

In order to solve the problem about planarizing Group III nitride-based compound semiconductor substrates, attempts have been made to perform heat treatment, or a combination of heat treatment and other treatments. Japanese Patent Application Laid-Open (kokai) Nos. 2003-327497, 2005-136311 and 2004-273484 disclose such techniques.

The techniques disclosed in the first and the second patent documents each include heating a surface of a GaN substrate in an ammonia-hydrogen atmosphere at 1,000° C. or higher for 10 minutes or longer. The third patent document discloses the technique to set the heat treatment temperature lower than the following GaN vapor growth temperature and to reduce the supply of material gas containing a group III element lower than that at the following epitaxial growth.

When the present inventors performed those heat treatments disclosed in the first and the second patent documents, solidified products of Ga droplets (hereinafter referred to as "solidified Ga droplets") were observed on the surface of the GaN substrate by an atomic force microscope (AFM) or a metallographical microscope. The formation of solidified Ga droplets indicates that nitrogen evaporated from the surface of the GaN substrate during heating, and remaining Ga atoms aggregated. When a GaN substrate having solidified Ga droplets on the surface thereof is employed as an epitaxial growth substrate, the film grown on the substrate fails to have uniformly high crystallinity over the entire wafer surface. In other words, when a GaN substrate is treated by a technique disclosed in the patent documents, the formed epitaxial film fails to have high crystallinity, and a semiconductor device layer formed on the epitaxial film fails to exhibit excellent characteristics. In addition, a method disclosed in the third patent document causes a problem such as enhancing decomposition of GaN substrate and appearance of Ga particles since epitaxial growth temperature is higher than that of cleaning process.

SUMMARY OF THE INVENTION

In view of the foregoing, an object of the present invention is to establish the surface treatment technique which removes micro-scratches and prevents solidified Ga droplets from remaining on the surface of the substrate so as to enhance crystallinity of an epitaxial film grown on the substrate. The other object of the present invention is, in addition to those effects, to establish the surface treatment technique which enables us to obtain substrates having a good step condition and a smooth surface.

According to the first aspect of the present invention, there is provided a method for producing a Group III nitride-based compound semiconductor product comprising:

performing a surface treatment of a Group III nitride-based compound semiconductor substrate having been polished in an atmosphere containing a Group III element source precursor, ammonia and hydrogen during heating the surface in order to make the surface of the semiconductor substrate smooth, and epitaxially growing a Group III nitride-based compound semiconductor on the treated surface.

As used herein, the concept "polishing" encompasses mechanical polishing by use of abrasive grains, micro-powder, etc., and chemical mechanical polishing by use of a liquid in which micro-powder has been dispersed. The Group III nitride-based compound semiconductor substrate having micro-scratches (i.e., scratches formed by polishing) on a surface after polishing has variation in height from portion to portion on the surface, and the root mean square (RMS) roughness of the surface is generally 10 nm or less.

The second aspect of the invention is drawn to a specific embodiment of the above production method, wherein the surface treatment is performed under near equilibrium conditions where the rate of growth and the rate of decomposition of a Group III nitride are nearly equal.

The third aspect of the invention is drawn to a specific embodiment of the production method, wherein the temperature and the feed rate of a group III element source precursor at the surface treatment are set at near equilibrium conditions where a group III nitride-based compound semiconductor does not grow. The surface treatment carried out under the conditions where decomposition rate of Group III nitride is slow makes it possible to eliminate micro-scratches without solidified Ga droplets. This leads the substrate surface has a small root mean square roughness RMS.

The fourth aspect of the invention is drawn to a specific embodiment of the production method, wherein the surface of the substrate is heated at temperature range from 1,000° C. to 1,250° C. The heating temperature is preferably 1,100° C. to 1,200° C.

It is preferable that the heating temperature is 1,100° C. or higher and equal to or higher than an optimum growth temperature of a Group III nitride-based compound semiconductor which is grown after the surface treatment. As the treatment temperature is increased, the effect of mass transport is enhanced and the micro-scratches are removed more effectively.

The fifth aspect of the invention is drawn to a specific embodiment of the production method, wherein the Group III nitride-based compound semiconductor substrate is a GaN substrate, and growth temperature of Group III nitride after the surface treatment is decreased by any value within the range from 0° C. to 400° C. from the surface treatment temperature.

The sixth aspect of the invention is drawn to a specific embodiment of the production method, wherein the Group III element source precursor is trimethylgallium, and the feed rate of trimethylgallium at the growth of GaN after the surface treatment is higher than the feed rate of trimethylgallium at the surface treatment.

The seventh aspect of the invention is drawn to a specific embodiment of the production method, wherein trimethylgallium for the surface treatment is supplied at a feed rate of 15 μmol/min to 2 mmol/min. It is preferable that the feed rate is 150 μmol/min to 200 μmol/min.

The eighth aspect of the invention is drawn to a specific embodiment of the production method, wherein the Group III nitride-based compound semiconductor substrate is a GaN substrate and the Group III element source precursor is trimethylgallium, and the feed rate of trimethylgallium is set at any value within the range in which a GaN does not substantively grow. It is preferable that the feed rate of trimethylgallium is set under near equilibrium conditions where decomposition of GaN occurs a little.

The ninth aspect of the invention is drawn to a specific embodiment of the production method, wherein the ratio of ammonia feed rate to trimethylgallium feed rate (V/III ratio); i.e., the ratio of nitrogen atoms fed as ammonia to gallium atoms fed as trimethylgallium, is 1,200 to 4,000. It is preferable that the V/III ratio is 1,800 to 3,600. It is more preferable that the V/III ratio is 2,000 to 3,000. Under these conditions, the substrate having smooth surface can be obtained.

The tenth aspect of the invention is drawn to a specific embodiment of the production method, wherein the surface treatment of the substrate is performed at a temperature equal to or higher than the following epitaxial growth temperature of a Group III nitride-based compound semiconductor. It is preferably that the surface treatment is performed at the temperature higher than the following Group III nitride-based compound semiconductor growth within the range of 0° C. to 400° C.

The eleventh aspect of the invention is drawn to a specific embodiment of the production method according to the tenth aspect, wherein the feed rate of the Group III element source precursor at the surface treatment is less than that at the following group III nitride-based compound semiconductor growth.

The twelfth aspect of the invention is drawn to a specific embodiment of the production method, wherein the surface treatment of the substrate is performed at a temperature such that a surface of the semiconductor substrate has a minimum micro-scratch area density, and at a feed rate or Group III element source precursor such that the surface of the semiconductor substrate has a minimum Ga droplet area density. A micro-scratch area density means product of number of scratch per unit area and the scratch area per one scratch. An area for one scratch is sum of the bottom surface of the groove of the scratch and side surface area. A Ga droplet area density is product of number of Ga droplet per unit area and the Ga droplet area per one Ga droplet. As the surface treatment temperature is increased, the scratch area density decreases, but the Ga droplet area density increases. As the Group III element source precursor feed rate is increased, the Ga droplet area density decreases. Therefore, by controlling the surface treatment temperature and the Group III element source precursor feed rate to optimum levels, both the micro-scratch area density and the Ga droplet area density can be minimized.

The thirteenth aspect of the invention is drawn to a specific embodiment of the production method, wherein the surface treatment of the substrate is performed under the conditions of temperature, a feed rate of the Group III element source precursor and a feed rate of ammonia such that a surface of the semiconductor substrate has a minimum micro-scratch area density and a minimum Ga droplet area density and excellent step condition. As the ammonia feed rate is increased, a root mean square roughness decreases and excellent step condition can be obtained. However, when the ammonia feed rate exceeds a certain level, protrusion appears, a root mean square roughness increases and the surface smoothness degrades. Therefore, through controlling the surface treatment temperature, the Group III element source precursor feed rate, and the ammonia feed rate within the optical levels, both the micro-scratch area density and the Ga droplet area density can be minimized and the excellent step condition can be realized.

The fourteenth aspect of the invention is drawn to a specific embodiment of the production method, wherein the surface treatment of the substrate is performed under the conditions of temperature, a feed rate of the Group III element source precursor and a feed rate of ammonia such that the semiconductor surface has a root mean square roughness of 2.2 nm or less. It is preferable that the semiconductor surface has a root mean square roughness of 1.3 nm or less.

In a preferred situation, among the scratches of the surface of a Group III nitride-based compound semiconductor substrate by polishing, protruded portions are preferentially decomposed, and the Group III element released by decomposition is supplied to grooves, where Group III nitride is formed. According to a study carried out by the inventors, when the semiconductor substrate surface is heated in an atmosphere containing only ammonia, Group III atoms released by decomposition aggregate to form droplets, but such droplets do not bury grooves through formation of nitride. When the semiconductor substrate surface on which such droplets of Group III atoms remain is cooled, the droplets form metallic grains, which remain deposited on the semiconductor substrate surface. Therefore, if such a substrate is employed as an epitaxial growth substrate, epitaxial growth starts on a surface on which metallic grains remain, and the crystallinity of the formed Group III nitride-based compound semiconductor film is degraded.

Based on the inventors' finding given hereinbelow, formation of droplets of Group III atoms can be prevented by supplying a Group III element source precursor with ammonia during heat treatment. In the surface treatment, it is considered that hydrogen serving as a carrier gas contributes to decomposition of protruded portions of the Group III nitride-based compound semiconductor substrate surface.

Two possible reasons for preventing the formation of metallic droplets by supplying a Group III element source precursor are as follows.

The first is that supplying a Group III element source precursor with ammonia during heat treatment increases the partial pressure of atomic Group III element or of a Group III element compound in the gas phase, whereby decomposition of a Group III nitride-based compound semiconductor near the surface of the substrate is suppressed. Therefore, the Group III nitride-based compound semiconductor is moved, without decomposing to nitrogen and Group III element, from the protrusions to the grooves via mass transport. As a result, the substrate surface is planarized.

The second is as follows.

In the case where droplets of Group III atoms are formed through rapid decomposition of a Group III nitride-based compound semiconductor (e.g., protruded portions of the substrate surface) and release of nitrogen (as nitrogen molecules) at high temperature, droplets of Group III atoms are not sufficiently consumed through only reaction between ammonia and Group III atoms at the surfaces of the droplets. In other words, even if a chemical bond such as Group III atom-nitrogen atom-Group III atom is formed, the rate of dissociation of nitrogen (as nitrogen molecule) (i.e., decomposition) predominates.

By supplying a Group III element source precursor, a nitride adduct having a plurality of Group III atoms in a molecule thereof promotes removal of Group III atoms from the droplets. That is, when a nitride adduct having a plurality of Group III atoms in a molecule thereof attacks the surfaces of the droplets of Group III atoms at high temperature, the nitride adduct actively takes in Group III atoms to thereby form "a nitride adduct having higher molecular weight," eventually forming a GaN crystal. The nitride adduct having a plurality of Group III atoms in a molecule thereof has a plurality of Group III atom-nitrogen atom bonds, and also has a Group III atom bonded to three nitrogen atoms. Thus, even though a part of the bonds is broken, only "a nitride adduct having a low molecular weight" is formed, and not all nitrogen atoms are released to form nitrogen molecules.

It is required that the heating temperature is 1,000° C. to 1,250° C. When the temperature is lower than 1,000° C., the rate of decomposition of protrusions is extremely slow, whereas when the temperature in higher than 1,250° C., the rate of decomposition of protrusions is excessively fast. Needless to say, in either case, the effects of the present invention cannot be achieved. It is preferable that the heating temperature is 1,100° C. to 1,200° C.

In addition, it is preferable that the surface treatment temperature is equal to or higher than the temperature at which a Group III nitride-based compound semiconductor is epitaxially grown after the surface treatment. In other words, when the surface treatment temperature is set to be higher than the optimum growth temperature of a Group III nitride-based compound semiconductor, the surface of the substrate can be readily kept planarized until the beginning of the following epitaxial growth process.

The present invention can be readily carried out by using a GaN substrate, which is a currently readily available Group III nitride-based compound semiconductor substrate, and trimethylgallium, which is also a readily available source precursor. When the trimethylgallium feed rate is less than 15 μmol/min, re-nitriding of Ga droplets, formed through decomposition of Group III nitride, is difficult. The upper limit of the trimethylgallium feed rate is 2 mmol/min from the viewpoints of sufficient decomposition of protrusions of a GaN substrate and prevention of formation of unnecessarily thick epitaxial film. It is preferably that the trimethylgallium feed rate of the surface treatment is 150 μmol/min to 200 μmol/min. As found through observation by an atomic force microscope (AFM), when the V/III ratio is lower than 1,200, the steps of the GaN surface are not improved whereas when the V/III ratio is 4,000 or more, a rough portion of a large area (10 μm×10 μm or larger) tends to form. According to the results of observation by an atomic force microscope (AFM), it is preferable that the V/III ratio is 1,800 to 3,600. It is more preferably that the V/III ratio is 2,000 to 3,000.

In addition, when the trimethylgallium feed rate is not supplied enough, Ga droplet can be readily produced. On the other hand, when the trimethylgallium feed rate is supplied too much, a nitride film is formed without disappearance of the micro-scratch due to the growth of a Group III nitride-based compound semiconductor on the substrate. Therefore, it is preferable that the trimethylgallium feed rate is set to be a value near equilibrium state in which the growth rate of a Group III nitride is slower than the decomposition rate of that.

DETAILED DESCRIPTION OF PREFERRED EMBODIMENTS

It is preferable that the carrier gas is hydrogen or mixed gas of hydrogen and rare gas such as argon. A carrier gas composed of only nitrogen is not preferable. However, unless nitrogen is incorporated into the carrier gas in an amount of more than 50%, it is expected that the effects of the present invention are not reduced.

The embodiment described below is about the surface treatment of a polished surface of a GaN substrate by heating in an atmosphere containing trimethylgallium and ammonia. However, the present invention also encompasses the cases where surface treatment of a Group III nitride-based compound semiconductor substrate having any Group III element and compositional proportions is performed by heating in an atmosphere containing ammonia and source precursors for Group III elements of interest.

Embodiment

Figure 1:
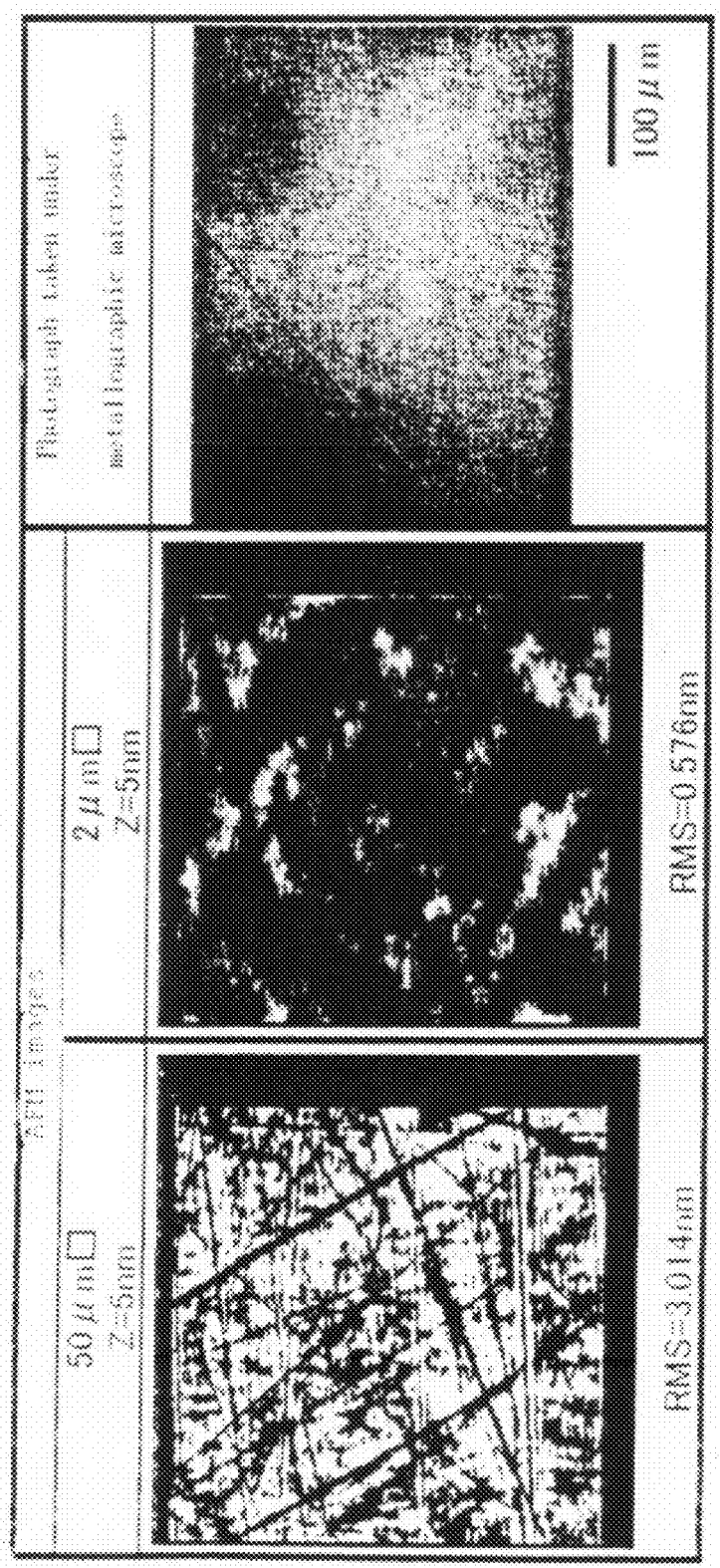
FIG. 1 includes three photographs, each showing a surface of a GaN substrate before performance of the surface treatment of the present invention.

In this Embodiment, the Ga face of a GaN substrate was treated. Before surface treatment, by AFM image analysis, the surface of the Ga face was found to have a root mean square roughness (RMS) of 3.0 nm as measured in a 50 μm×50 μm area. The surface was also observed using a metallographic microscope, and a number of scratch lines extending in various directions were observed. That is, a number of micro-scratches remained on the surface of the GaN substrate. The results are shown in FIG. 1. The three photographs in FIG. 1 show an AMF image (50 μm×50 μm), an AMF image (2 μm×2 μm), and a metallographic microscopic photograph (left to right), respectively. RMS of 0.58 nm was measured in a 2 μm×2 μm area, but steps are not observed. Therefore, it is hard to say the substrate is optimum for crystal growth.

Firstly, GaN substrates were heated at 1000-1160° C. for 7 minutes in an atmosphere in which hydrogen and ammonia were supplied at feeding rates of 29 SLM and 7 SLM, respectively, and then cooled to room temperature. The surfaces of heat treated substrates were observed by AFM. In these experiments, trimethylgallium (herein after abbreviated as TMG) was not supplied.

Experiment 1 (Temperature: 1,160° C.):
RMS is 45.21 nm in a 50 μm×50 μm area, RMS is 0.21 nm in a 2 μm×2 μm area, and roughness generally attributed to Ga droplets having the diameter of around 5 μm.

Experiment 2 (Temperature: 1,100° C.):
RMS was 9.25 nm in a 50 μm×50 μm area, RMS was 0.17 nm in a 2 μm×2 μm area, and roughness was generally attributed to Ga droplets, which were fewer and smaller (around 1 μm) than those observed in Experiment 1;

Experiment 3 (Temperature: 1,050° C.):
RMS was 7.43 nm in a 50 μm×50 μm area, RMS was 0.17 nm in a 2 μm×2 μm area, and roughness was generally attributed to Ga droplets, which were smaller (less than 1 μm) but more numerous than those observed in Experiment 2; and Experiment 4 (Temperature: 1,000° C.):
RMS was 2.45 nm in a 50 μm×50 μm area, RMS was 0.13 nm in a 2 μm×2 μm area, and smaller Ga droplets were observed. In Experiments 2 and 3, RMS is 0.17 nm in a 2 μm×2 μm area and atomic-scale steps were observed. Especially, the step condition in Experiment 3 is excellent. However, in Experiments 1 and 4, atomic-scale steps were not observed, otherwise the step condition was bad.

Figure 2:
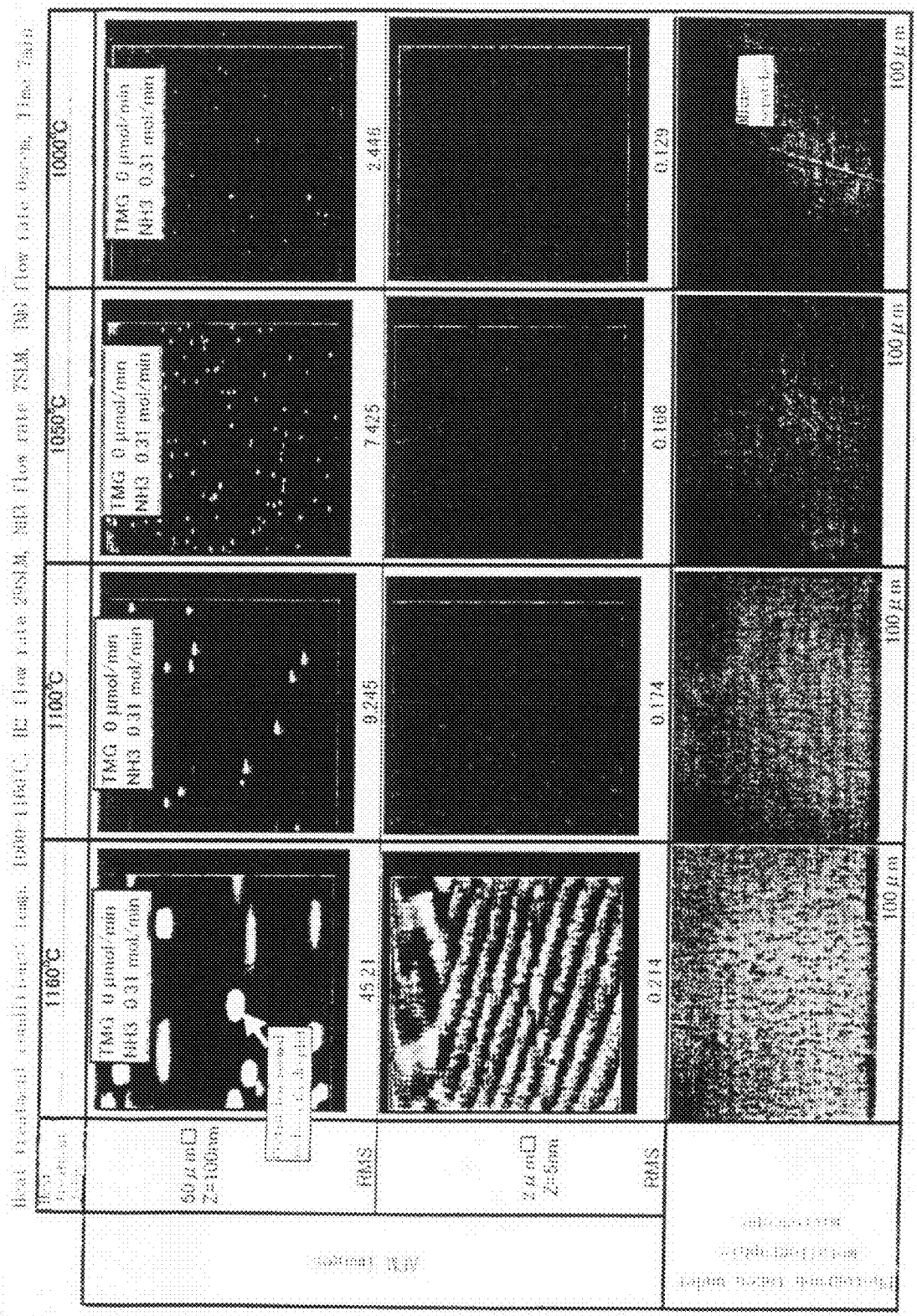
FIG. 2 includes 12 photographs, each showing a surface of a GaN substrate after performance of the surface treatment of any of Experiments 1 to 4 of the present invention, with a set of three photographs given to each Experiment.

In Experiment 4 (temperature: 1,000° C.), micro-scratches still remained on the surface, as confirmed by metallographic microscope observation. In Experiment 1 (temperature: 1,160° C.), it was observed that solidified Ga droplets were formed, but micro-scratches were removed. The results are shown in FIG. 2. Among 12 photographs, the four in the upper row each show an AMF image (50 μm×50 μm), the four in the middle row each show an AMF image (2 μm×2 μm), and the four in the lower row each show a metallographic microscopic photograph (corresponding to Experiments 1 to 4, left to right), respectively.

From the results of the Experiments 1 to 4, it was found that micro-scratch area density decreased and the Ga droplet area density increased, as the surface treatment temperature was increased. However, under these experimental conditions, we were not able to remove micro-scratches and prevent Ga droplets from generating.

Secondly, GaN substrates were heated at 1160° C. for 7 minutes in an atmosphere in which hydrogen (29 SLM), ammonia (7 SLM) and TMG (0-173 μmol/min). The TMG feeding rate was predetermined as follows.

Experiment 1 (TMG Feeding Rate: 0):
RMS was 45.21 nm in a 50 μm×50 μm area, RMS was 0.21 nm in a 2 μm×2 μm area, and roughness was generally attributed to Ga droplets (as described above);

Experiment 5 (TMG Feeding Rate: 120 μmol/min):
RMS was 6.00 nm in a 50 μm×50 μm area, RMS was 0.22 nm in a 2 μm×2 μm area, and Ga droplets were observed; and Experiment 6 (TMG Feeding Rate: 173 μmol/min):
RMS was 2.24 nm in a 50 μm×50 μm area, RMS was 0.23 nm in a 2 μm×2 μm area, and Ga droplets were not observed.

From the results of Experiment 5 and 6, a TMG feed rate of 120 μmol/min was not sufficient and the TMG feed rate of more than 173 μmol/min was required for preventing deposition of Ga droplets. As is obvious from above six experiments, to control the surface treatment temperature and the TMG feeding rate appropriately leads to remove micro-scratches and prevent Ga droplets from generating simultaneously. Thus, the grooves of micro-scratches are buried by mass transport without formation of Ga droplets by means of applying heat treatment under the conditions of near equilibrium state where the rate of growth of a Group III nitride is smaller than that of decomposition.

Figure 3:
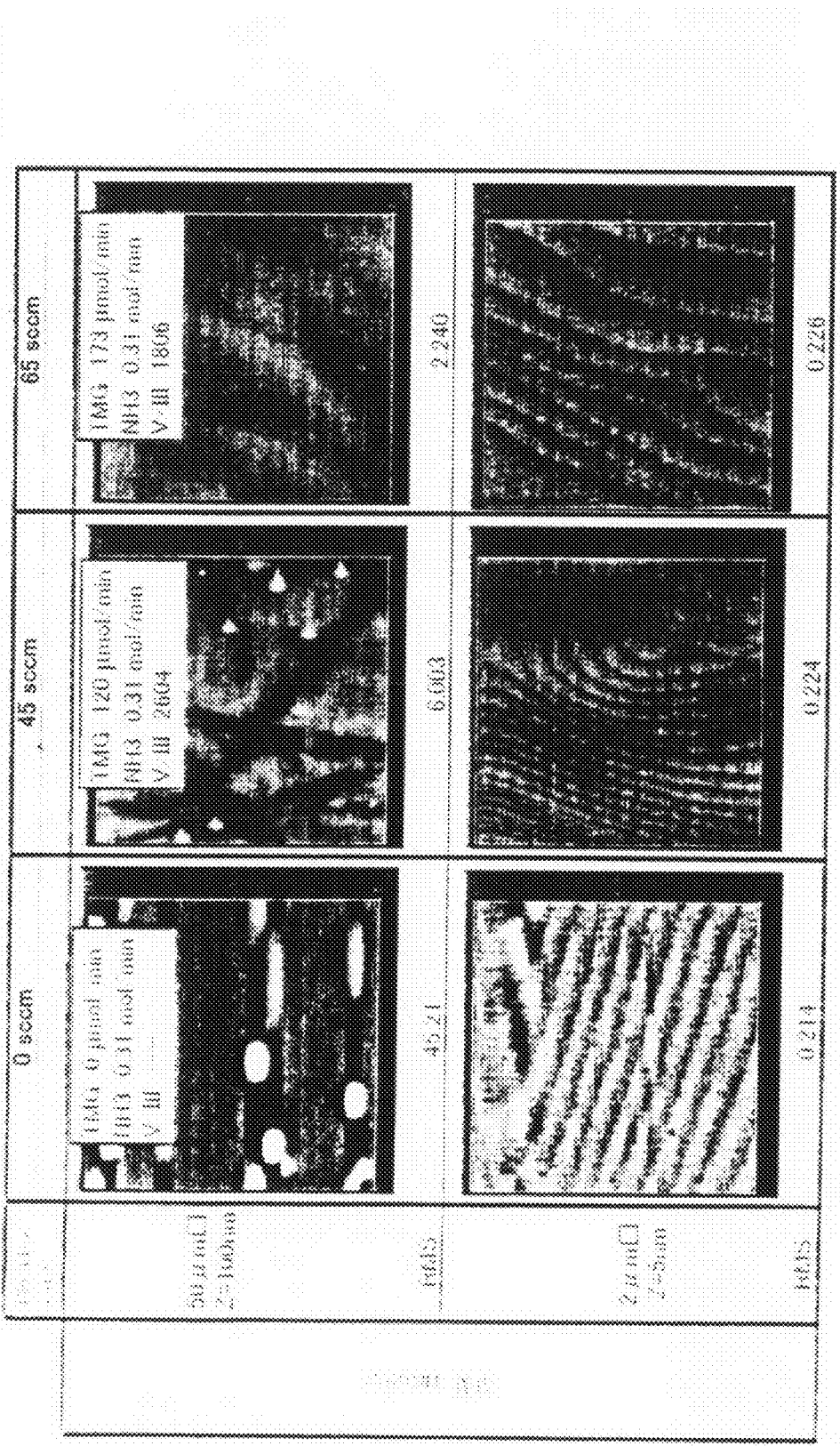
FIG. 3 includes 6 photographs, each showing a surface of a GaN substrate after performance of the surface treatment of any of Experiments 1, 5, and 6 of the present invention, with a set of two photographs given to each Experiment.

As observed through AFM image analysis, in Experiment 6 (TMG feed rate: 173 μmol/min), the degraded step condition of the surface-treated GaN substrate was observed, as compared with Experiment 5 (TMG feeding rate: 120 μmol/min). The results are shown in FIG. 3. Among 6 photographs, the three in the upper row each show an AMF image (50 μm×50 μm), and the three in the lower row each show an AMF image (2 μm×2 μm) (corresponding to Experiments 1, 5, and 6, left to right).

From the results of Experiments 1, 5, and 6, it is found that the Ga droplet area density decreased but the step condition degraded, as the Group III element source precursor feeding rate was increased.

Thirdly, GaN substrates were heated at 1160° C. for 7 minutes in an atmosphere in which hydrogen (22-29 SLM), ammonia (7-14 SLM) and TMG (173 μmol/min). A total of hydrogen and ammonia feeding rates is maintained at 36 SLM.

Experiment 6 (Ammonia Feeding Rate: 7 SLM, i.e., 0.31 mol/min):
RMS was 2.24 nm in a 50 μm×50 μm area, RMS was 0.23 nm in a 2 μm×2 μm area, and the step condition was bad (as described above);

Experiment 7 (Ammonia Feeding Rate: 10.5 SLM, i.e., 0.47 mpl/mon):
RMS was 1.31 nm in a 50 μm×50 μm area, RMS was 0.24 nm in a 2 μm×2 μm area, and the step condition was excellent; and Experiment 8 (Ammonia Feeding Rate: 14 SLM, i.e., 0.63 mol/min):
RMS was 3.47 nm in a 50 μm×50 μm area, RMS was 0.21 nm in a 2 μm×2 μm area, and an uneven area (about 10 μm× 10 μm) was formed.

Figure 4:
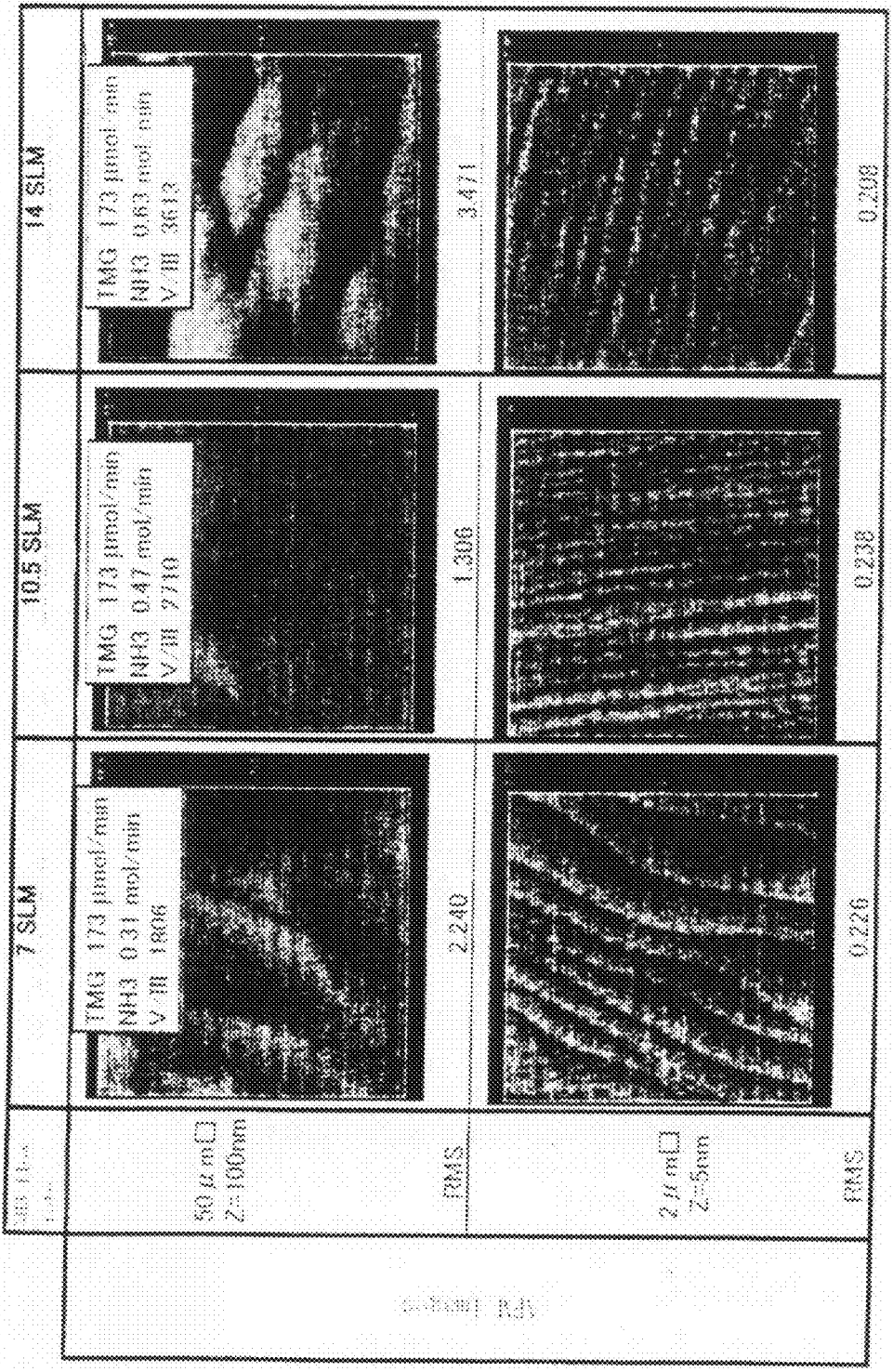
FIG. 4 includes 6 photographs, each showing a surface of a GaN substrate after performance of the surface treatment of any of Experiments 6 to 8, with a set of two photographs given to each Experiment.

As found in Experiment 6 employing an ammonia feeding rate of 7 SLM (V/III ratio: 1,806), the step condition was bad. As found in Experiment 8 employing an ammonia feeding rate of 14 SLM (V/III ratio: 3,613), an uneven surface portion was formed. In contrast, as found in Experiment 7 employing an ammonia feeding rate of 10.5 SLM (V/III ratio: 2,710), the step condition was excellent, and an uneven surface portion was not formed. The results are shown in FIG. 4. Among 6 photographs, the three in the upper row each show an AMF image (50 μm×50 μm), and the three in the lower row each show an AMF image (2 μm×2 μm) (corresponding to Experiments 6, 7, and 8, left to right).

In Experiments 6, 7, and 8, the RMS of unevenness decreased and the step condition was improved, as the V/III ratio was increased. However, when V/III ratio exceeded a certain level, the RMS of unevenness increases and the step condition degraded. Therefore, through controlling the surface treatment temperature, the Group III element source precursor feed rate and V/III ratio appropriately, the microscratches can be removed and the Ga droplet area density can be minimized more effectively, in addition, excellent step conditions can be obtained.

Figure 5:
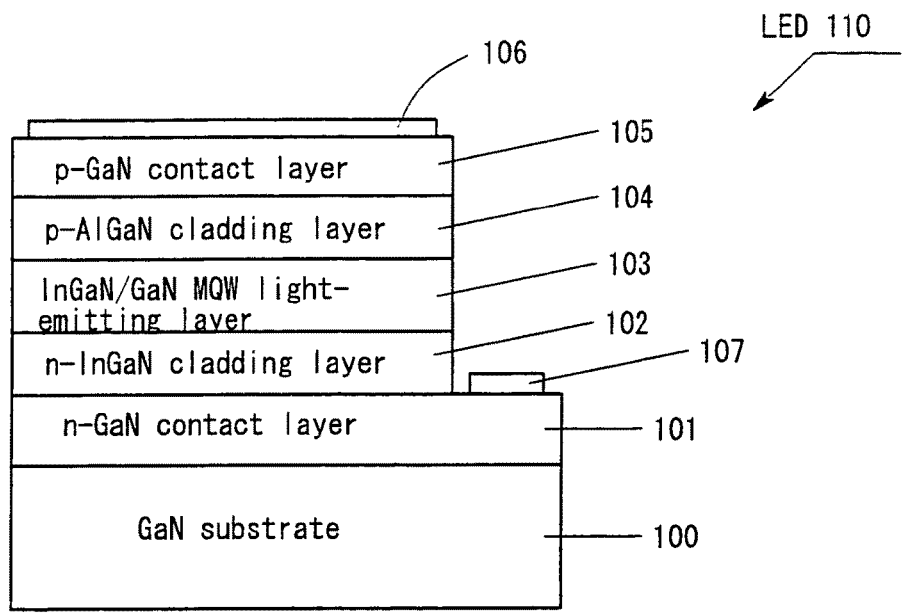
FIG. 5 is a schematic drawing of cross section of a light emitting device according to the Example of the present invention.

Then, in order to evaluate the effect of the surface treatment in the present invention, LED devices were formed on GaN substrates with two different surface treatments. Photoluminescence and electroluminescence properties of the devices were measured. The structure of the LED devices 110 were schematically described in FIG. 5.

On a GaN substrate 100 with the surface-treatment under the condition of Experiment 7, an n-type GaN contact layer 101 was grown under the conditions where growth temperature was 1160° C., TMG feeding rate was 360 μmol/min, ammonia feeding rate was 6.9 SLM, i.e., 0.31 mol/min, III/V ratio was 861, hydrogen feeding rate was 25.5 SLM. Then, an n-type InGaN cladding layer 102 was formed on the n-contact layer 101 at 850° C. by supplying TMG, TMI and $NH_3$ as precursors and $N_2$ as carrier gas. Subsequently, InGaN/GaN MQW light-emitting layers 103, a p-type AlGaN cladding layer 104, and a p-type GaN contact layer 105 were sequentially grown. Next, a portion of the deposition layer from the p-type contact layer 105 to the n-type contact layer 101 was removed by etching. Next, a transparent or a reflective p-electrode 106 was formed on the p-type contact layer 105 and n-electrode 107 was formed on the surface of the exposed n-type contact layer 101.

As a Comparative Example, an LED 11 was fabricated in a manner similar to the above procedure, except that a GaN substrate 10 treated under the condition of Experiment 1. The GaN substrate has numerous Ga droplets on a surface.

The photoluminescence (PL) intensities of the LED 110 and LED 11 were measured. The LED 110, fabricated on the GaN substrate 100 with the surface treatment of the present invention, exhibited a PL emission 1.5 times as strong as that of the LED 11, fabricated on the GaN substrate 10 (Comparative Example) on which Ga droplets remained.

The electroluminescence (EL) intensities of the two LEDs were also measured. The LED 110, fabricated on the GaN substrate 100 which had been subjected to the surface treatment of the present invention, exhibited an EL intensity 1.1 times as strong as that of the LED 11, fabricated on the GaN substrate 10 (Comparative Example) on which Ga droplets remained.

The enhancement in PL intensity and EL intensity was attained due to the excellent crystallinity of the LED 110 fabricated on the surface-treated GaN substrate 100, as compared with that of the LED 11 fabricated on the GaN substrate 10 on which numerous Ga droplets remained.

In above procedure for fabricating LED devices, the growth temperature of the n-type GaN contact layer can be decreased from the treatment temperature by any value within the range of 0° C. to 400° C. The change of material gas feeding rate for the growth of n-contact layer can be carried out either before or after decreasing the temperature.

Figure 6:
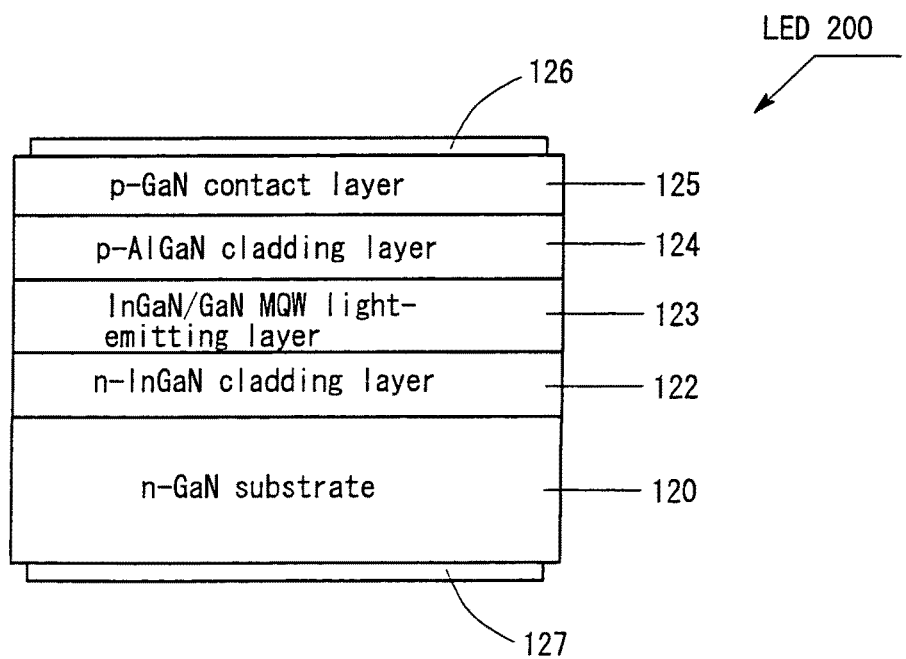
FIG. 6 is a schematic drawing of cross section of a light emitting device according to an another Example of the present invention.

The crystal growth on GaN substrate may be performed as follows. In an LED structure described in FIG. 6, the heat treatment of an n-type GaN substrate 120 was performed under the condition of Experiment 7. Then, the material gas and carrier gas were changed from TMG to TMG/TMI and $H_2$ to $N_2$, respectively, and the substrate temperature was decreased from 1160° C. to 850° C. This made an n-type InGaN cladding layer 122 grow on the n-type GaN substrate 120. Subsequently, InGaN/GaN MQW light-emitting layers 123, a p-type AlGaN cladding layer 124, and a p-type GaN contact layer 125 were grown. Then, a transparent or reflective p-electrode 126 and n-electrode 127 were formed on the p-type contact layer 125 and on the back side of the n-type GaN substrate 120, respectively. As the growth temperature of the n-type InGaN cladding layer 122 is in the range lower by 300° C. than the surface treatment temperature of 1160° C., smoothness and the step condition of the substrate surface are not impaired before the crystal growth begins. In addition, forming n-type InGaN cladding layer directly on the GaN substrate does not degraded crystalline quality of MQW layers because an extremely high-quality GaN surface has been obtained by means of the surface treatment of the present invention. It was confirmed that the EL intensity of LED 200, which is obtained in this matter, is equal to or stronger than that of LED 110.

As above described, in the present invention it is characterized that the surface treatment of the substrate is performed under the near equilibrium conditions where the rate of growth and the rate of decomposition of a Group III nitride are nearly equal. And it is characterized that the surface scratches of the substrate are removed during above surface treatment.

For the growth of Group III nitride-based compound semiconductors after the substrate surface treatment, decreasing temperature and/or increasing Group III element source precursor, compared with surface treatment conditions, are required. Increasing temperature for the growth of Group III nitride after surface treatment is not preferable since increasing temperature causes the formation of Ga droplets on the substrate surface. For growing a Group III nitride-based compound semiconductor after the substrate surface treatment, the excellent surface condition of the substrate is maintained by keeping the temperature to the same value as the treatment temperature or decreasing the temperature from the treatment temperature.

Through performance of the surface treatment of the present invention, a Group III nitride-based compound semiconductor substrate having a considerably flat surface can be produced, and a high-quality Group III nitride-based compound semiconductor crystal can be grown on the substrate. The Group III nitride-based compound semiconductor substrate with surface treatment of the present invention is remarkably useful for fabricating semiconductor device such as light-emitting devices or FETs.

What is claimed is:

1. A method for producing Group III nitride-based compound semiconductor products comprising:
    performing a surface treatment of a Group III nitride-based compound semiconductor substrate, whose surface having been polished, in an atmosphere containing a Group III element source precursor, ammonia, and hydrogen during heating in order to make the surface of the semiconductor substrate smooth, and
    epitaxially growing a Group III nitride-based compound semiconductor on the treated surface.

2. A method for producing Group III nitride-based compound semiconductor products according to claim 1, wherein the surface treatment is performed under the conditions which realize a near equilibrium state in which the rate of growth and the rate of decomposition of a Group III nitride are nearly equal.

3. A method for producing Group III nitride-based compound semiconductor products according to claim 1, wherein a surface treatment temperature and a feed rate of a Group III element source precursor are set to realize a near equilibrium state between the growth and the decomposition of a Group III nitride, and to prevent a Group III nitride-based compound semiconductor from growing.

4. A method for producing Group III nitride-based compound semiconductor products according to claim 1, wherein the surface of the substrate is heated at 1,000° C. to 1,250° C.

5. A method for producing Group III nitride-based compound semiconductor products according to claim 3, wherein the surface of the substrate is heated at 1,000° C. to 1,250° C.

6. A method for producing Group III nitride-based compound semiconductor products according to claim 1, wherein the Group III nitride-based compound semiconductor substrate is a GaN substrate, and a growth temperature of nitride gallium after the surface treatment decreases by any value within the range from 0° C. to 400° C. from the surface treatment temperature.

7. A method for producing Group III nitride-based compound semiconductor products according to claim 3, wherein the Group III nitride-based compound semiconductor substrate is a GaN substrate, and a growth temperature of Group III nitride after the surface treatment is decreased by any value within the range from 0° C. to 400° C. from the surface treatment temperature.

8. A method for producing Group III nitride-based compound semiconductor products according to claim 5, wherein the Group III nitride-based compound semiconductor substrate is a GaN substrate, and a growth temperature of Group III nitride after the surface treatment decreases by any value within the range from 0° C. to 400° C. from the surface treatment temperature.

9. A method for producing Group III nitride-based compound semiconductor products according to claim 6, wherein the Group III element source precursor is trimethylgallium, and a feed rate of trimethylgallium for growing a gallium nitride after the surface treatment is increased more than that for the surface treatment.

10. A method for producing Group III nitride-based compound semiconductor products according to claim 7, wherein the Group III element source precursor is trimethylgallium, and a feed rate of trimethylgallium for growing a gallium nitride after the surface treatment is increased more than that for the surface treatment.

11. A method for producing Group III nitride-based compound semiconductor products according to claim 8, wherein the Group III element source precursor is trimethylgallium, and a feed rate of trimethylgallium for growing a gallium nitride after the surface treatment is increased more than that for the surface treatment.

12. A method for producing Group III nitride-based compound semiconductor products according to claim 9, wherein trimethylgallium for the surface treatment is supplied at a feed rate of 15 μmol/min to 2 mmol/min.

13. A method for producing Group III nitride-based compound semiconductor products according to claim 1, wherein the Group III nitride-based compound semiconductor substrate is a GaN substrate, and a feed rate of trimethylgallium is in the range where a gallium nitride is not substantively grown.

14. A method for producing Group III nitride-based compound semiconductor products according to claim 9, wherein the ratio of ammonia feed rate to trimethylgallium feed rate, represented by the ratio (V/III) of nitrogen atoms fed as ammonia to gallium atoms fed as trimethylgallium, is 1,200 to 4,000.

15. A method for producing Group III nitride-based compound semiconductor products according to claim 11, wherein the ratio of ammonia feed rate to trimethylgallium feed rate, represented by the ratio (V/III) of nitrogen atoms fed as ammonia to gallium atoms fed as trimethylgallium, is 1,200 to 4,000.

16. A method for producing Group III nitride-based compound semiconductor products according to claim 1, wherein the surface treatment of the substrate is performed at a temperature equal to or higher than that of the following Group III nitride-based compound semiconductor epitaxial growth.

17. A method for producing Group III nitride-based compound semiconductor products according to claim 1, wherein the surface treatment of the substrate is performed at feed rate of a Group III element source precursor being lower than that of a Group III element source precursor at which a Group III nitride-based compound semiconductor is epitaxially grown after the surface treatment.

18. A method for producing Group III nitride-based compound semiconductor products according to claim 1, wherein the surface treatment of the substrate is performed at a temperature controlled such that a surface of the semiconductor substrate has a minimum micro-scratch area density, and the Group III element source precursor is supplied at a feed rate controlled such that the surface of the semiconductor substrate has a minimum Ga droplet area density.

19. A method for producing Group III nitride-based compound semiconductor products according to claim 1, wherein the surface treatment of the substrate is performed at a temperature, a feed rate of the Group III element source precursor and a feed rate of ammonia such that a surface of the semiconductor substrate has a minimum micro-scratch area density and a minimum Ga droplet area density and excellent step condition.

20. A method for producing Group III nitride-based compound semiconductor products according to claim 1, wherein the surface treatment of the substrate is performed at a temperature, a feed rate of the Group III element source precursor and a feed rate of ammonia such that the semiconductor surface has a root mean square roughness of 2.2 nm or less.

* * * * *